United States Patent
Xu et al.

(10) Patent No.: US 11,923,832 B1
(45) Date of Patent: Mar. 5, 2024

(54) GATE DRIVER CIRCUIT WITH A LIMITING FUNCTION TO MAINTAIN CONTROL VOLTAGE UNDER A RATED LIMIT

(71) Applicant: Infineon Technologies Austria AG, Villach (AT)

(72) Inventors: Kuiwei Xu, Xi'an (CN); Weiwei Cao, Xi'An (CN)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/933,163

(22) Filed: Sep. 19, 2022

(51) Int. Cl.
*H03K 3/00* (2006.01)
*H03K 17/00* (2006.01)
*H03K 17/06* (2006.01)
*H03K 17/687* (2006.01)
*H03K 17/693* (2006.01)

(52) U.S. Cl.
CPC ................ *H03K 17/063* (2013.01)

(58) Field of Classification Search
None
See application file for complete search history.

(56) References Cited

U.S. PATENT DOCUMENTS

| | | | | |
|---|---|---|---|---|
| 6,268,628 B1 * | 7/2001 | Yoshida | ............ | H01L 29/7395 |
| | | | | 257/E29.198 |
| 6,970,023 B2 * | 11/2005 | Fedigan | ............ | H03K 17/691 |
| | | | | 327/434 |
| 7,459,954 B2 * | 12/2008 | Kuehner | ............ | H03K 17/166 |
| | | | | 363/51 |
| 7,660,137 B1 * | 2/2010 | Goins | ............ | H02M 1/088 |
| | | | | 363/52 |
| 8,203,377 B2 * | 6/2012 | Kelley | ............ | H03K 17/04123 |
| | | | | 327/170 |
| 10,536,070 B1 * | 1/2020 | Penzo | ............ | H01L 29/778 |
| 10,574,226 B2 * | 2/2020 | Narayanasamy | ............ | |
| | | | | H03K 17/08142 |
| 2002/0113274 A1 * | 8/2002 | Iwagami | ............ | H03K 17/74 |
| | | | | 257/213 |

* cited by examiner

*Primary Examiner* — Kenneth B Wells
(74) *Attorney, Agent, or Firm* — Harrity & Harrity, LLP

(57) ABSTRACT

A gate driver system includes a transistor configured to be driven between switching states, the transistor including a control terminal controlled by a control voltage that has a maximum rated limit; and a gate driver coupled to the control terminal by a turn-on current path, the gate driver being configured to control the control voltage in order to drive the transistor between the switching states. The turn-on current path includes a resistor and a Zener diode connected in series, with an anode of the Zener diode connected to the control terminal and a cathode of the Zener diode connected to the resistor. The turn-on current path is configured to provide an on-current to increase the control voltage above a switching threshold. While the transistor is turned on, the Zener diode is configured to limit the control voltage to a voltage level limit that is less than the maximum rated limit.

20 Claims, 1 Drawing Sheet

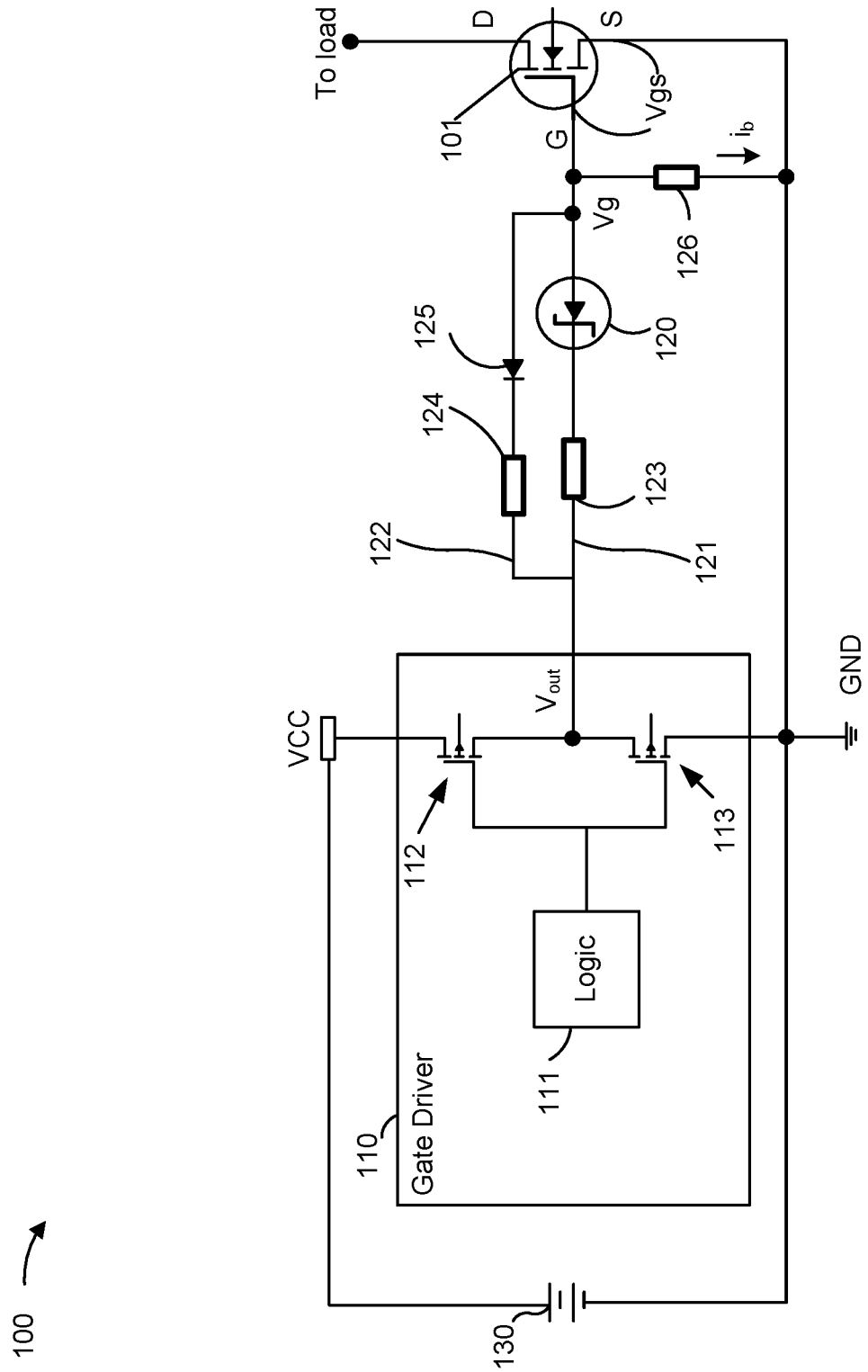

GATE DRIVER CIRCUIT WITH A LIMITING FUNCTION TO MAINTAIN CONTROL VOLTAGE UNDER A RATED LIMIT

BACKGROUND

Many functions of modern devices in automotive, consumer, and industrial applications, such as converting electrical energy and driving an electric motor or an electric machine, rely on semiconductor devices. For example, Insulated Gate Bipolar Transistors (IGBTs), Metal Oxide Semiconductor Field Effect Transistors (MOSFETs), and diodes, to name a few, have been used for various applications including, but not limited to switches in power supplies and power converters.

A transistor typically comprises a semiconductor structure configured to conduct a load current along a load current path between two load terminal structures of the transistor. Further, the load current path may be controlled by a control electrode, sometimes referred to as a gate electrode. For example, upon receiving a corresponding control signal from, e.g., a driver unit, the control electrode may set the semiconductor device in a conducting state or a blocking state. Accordingly, the semiconductor structure behaves like a switch with on and off states (i.e., conducting and blocking states, respectively).

SUMMARY

One or more implementations provide a gate driver system that includes: a transistor configured to be driven between switching states, the transistor including a control terminal, wherein a control voltage is a gate-source voltage or a gate-emitter voltage of the transistor and has a maximum rated limit; and a gate driver coupled to the control terminal of the transistor by a turn-on current path and a turn-off current path, the gate driver being configured to control the control voltage in order to drive the transistor between the switching states. The turn-on current path includes first resistor and a Zener diode connected in series, with an anode of the Zener diode connected to the control terminal and a cathode of the Zener diode connected to the first resistor, wherein the turn-on current path is configured to provide an on-current to increase the control voltage above a switching threshold. The turn-off current path includes a second resistor and a directional diode connected in series, wherein the second resistor and the directional diode are connected in parallel to the first resistor and the Zener diode, wherein the turn-off current path is configured to sink a first portion of an off-current to decrease the control voltage below the switching threshold. While the transistor is turned on, the Zener diode is configured to limit the control voltage to a voltage level limit that is less than the maximum rated limit.

One or more implementations provide a gate driver system that includes: a transistor configured to be driven between switching states, the transistor including a control terminal, a first load path terminal, and a second load path terminal, wherein the transistor is configured to conduct a load current from the first load path terminal to the second load path terminal, and wherein the control voltage is a voltage difference between a voltage at the control terminal and a voltage at the second load path terminal, wherein the control voltage has a maximum rated limit; and a gate driver coupled to the control terminal of the transistor by a turn-on current path and a turn-off current path, the gate driver being configured to control the control voltage in order to drive the transistor between the switching states. The turn-on current path includes first resistor and a Zener diode connected in series, with an anode of the Zener diode connected to the control terminal and a cathode of the Zener diode connected to the first resistor, wherein the turn-on current path is configured to provide an on-current to increase the control voltage above a switching threshold. The turn-off current path includes a second resistor and a directional diode connected in series, wherein the second resistor and the directional diode are connected in parallel to the first resistor and the Zener diode, wherein the turn-off current path is configured to sink a first portion of an off-current to decrease the control voltage below the switching threshold. While the transistor is turned on, the Zener diode is configured to limit the control voltage to a voltage level limit that is less than the maximum rated limit.

BRIEF DESCRIPTION OF THE DRAWINGS

Implementations are described herein making reference to the appended drawings.

FIG. 1 is a schematic block diagram of a gate driver system with a clamping or a limiting circuit according to one or more implementations.

DETAILED DESCRIPTION

In the following, details are set forth to provide a more thorough explanation of the exemplary implementations. However, it will be apparent to those skilled in the art that implementations may be practiced without these specific details. In other instances, well-known structures and devices are shown in block diagram form or in a schematic view rather than in detail in order to avoid obscuring the implementations. In addition, features of the different implementations described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the FIGS., a repeated description for elements provided with the same reference numbers may be omitted. Hence, descriptions provided for elements having the same or like reference numbers are mutually exchangeable.

In this regard, directional terminology, such as "top," "bottom," "below," "above," "front," "behind," "back," "leading," "trailing," etc., may be used with reference to the orientation of the FIGS. being described. Because parts of implementations can be positioned in a number of different orientations, the directional terminology is used for purposes of illustration. It is to be understood that other implementations may be utilized and structural or logical changes may be made without departing from the scope defined by the claims. The following detailed description, therefore, is not to be taken in a limiting sense. Directional terminology used in the claims may aid in defining one element's spatial or positional relation to another element or feature, without being limited to a specific orientation.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In implementations described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different implementations may be combined to form further implementations. For example, variations or modifications described with respect to one of the implementations may also be applicable to other implementations unless noted to the contrary.

The terms "substantially" and "approximately" may be used herein to account for small manufacturing tolerances (e.g., within 5%) that are deemed acceptable in the industry without departing from the aspects of the implementations described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a CD-ROM, DVD, Blu-ray disc, a RAM, a ROM, a PROM, an EPROM, an EEPROM, a FLASH memory, or an electronic memory device.

Each of the elements of the present disclosure may be configured by implementing dedicated hardware or a software program on a memory controlling a processor to perform the functions of any of the components or combinations thereof. Any of the components may be implemented as a central processing unit (CPU) or other processor reading and executing a software program from a recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable gate arrays (FPGAs) or other field programmable logic arrays, programmable logic controller (PLC), or other equivalent integrated or discrete logic circuitry.

Accordingly, the term "processor," as used herein refers to any of the foregoing structures or any other structure suitable for implementation of the techniques described herein. A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure. A controller may be, for example, a microcontroller, an FPGA, or a PLC, or other equivalent integrated or discrete logic circuitry. It may include any one of the above-noted processors or other equivalent integrated or discrete logic circuitry.

A semiconductor device usually comprises a semiconductor structure configured to conduct a load current along a load current path between two load terminal structures or load electrodes (e.g., a source/emitter and a drain/collector) of the semiconductor device. Further, the load current path may be controlled by a control electrode, sometimes referred to as a gate electrode. For example, upon receiving a corresponding control signal from, e.g., a driver unit, the control electrode may set the semiconductor device in one of a conducting state or a blocking state. A control signal may by a voltage signal or a current signal having a controlled value.

For example, a gate-source voltage Vgs of a Metal Oxide Semiconductor Field Effect Transistor (MOSFET) is typically driven down to 0 V or to a second supply potential to turn off the MOSFET and is typically driven to a maximum voltage value to fully turn on the MOSFET. The maximum voltage at the control electrode is typically the supply voltage generated by a positive power supply (e.g., high side supply), less any voltage drops between the positive power supply and the control electrode of the MOSFET. The threshold voltage (Vth) of a MOSFET needed to create a conducting path between load terminals is between these two Vgs voltage levels (e.g., between 0 V and the maximum voltage value). For this reason, the gate-source voltage Vgs of a MOSFET may be referred to as a control voltage. Accordingly, the MOSFET behaves like a switch with on and off states (i.e., conducting and blocking states, respectively).

Similarly, an Insulated Gate Bipolar Transistor (IGBT) is turned "ON" or "OFF" by activating and deactivating its gate. Applying a positive voltage signal across its gate and its emitter will keep the IGBT in the "ON" state, while making the voltage signal zero or slightly negative will cause the IGBT to turn "OFF". There is a turn-on process and a turn-off process for switching the IGBT on and off, referred to turn-on switching events and turn-off switching events, respectively.

Accordingly, a transistor can also be referred to as a power switch, a logic switch, or a transistor switch that may be used to drive a current, such as a load current. A transistor or similar switching device is designed according to a manufacturer's specifications with a rated maximum limit for the control voltage (e.g., Vgs or Vge) that represents a maximum voltage the transistor can handle without being damaged. Exceeding this rated maximum limit may cause the transistor to fail. Thus, it is important to ensure that the control voltage remains less than the rated maximum limit, for example, while the transistor is fully turned on. Without any protections, the control voltage will reach the level of the positive power supply during turn on of the transistor, less any small voltage drop incurred through a gate driver circuit that is interposed between the positive power supply and the control electrode of a transistor.

Power supplies are rated to provide a supply voltage within a certain tolerance range or predetermined margin. For example, a power supply rated at +15V may have a +/−10% tolerance range. In other words, the power supply may supply a voltage anywhere between 13.5V and 16.5V and still be considered operating normally within a manufacturer's specifications of +/−10%. If the rated limit for the control voltage (e.g., Vgs or Vge) is set close to the rated high side supply level (i.e., the positive supply rail), the control voltage during turn on may exceed its rated maximum limit. For example, some transistors have a rated limit of 16V or lower for its control voltage. If such a transistor is driven by a +15V power supply with a 10% tolerance, there will be a risk of exceeding the limit of +16V and causing damage to the transistor. The risk is elevated further by the fact that the supply voltage may exceed its rated supply voltage by a predetermined margin. Voltage spikes in the supply voltage could also occur. The higher the supply voltage, the higher the risk that the control voltage will exceed its rated maximum limit. Moreover, any power loss resulting from a protection circuit designed to prevent the control voltage from exceeding the rated maximum limit should be minimized or avoided altogether. The higher power losses lead to a decrease in efficiencies. It can cause a component to overheat and it increases the demand on the power supply.

Accordingly, one or more implementations, described herein, provide a gate driver system with a protection circuit that prevents a control voltage from exceeding a rated maximum limit of a transistor while introducing no to minimal power loss in the gate driver system, thereby improving or at least not hindering system efficiency while protecting the transistor.

Specific implementations described in this disclosure may pertain to, without being limited thereto, a voltage-controlled semiconductor device that may be used within a power converter or a power supply. Thus, in some implementations, the voltage-controlled semiconductor device may be configured to carry a load current that is to be supplied to a load and/or, respectively, that is provided by a power source.

Additionally, transistors which are suitably connected to form half-bridges are commonly used in the field of power electronics. For example, half-bridges comprising a first transistor and a second, complementary transistor, may be used for driving electric motors or switched mode power supplies. The first transistor may be referred to as a high-side transistor and the second transistor may be referred to as a low-side transistor. A gate driver, used for driving the transistors, is supplied with a fixed first supply potential by a positive supply rail and a fixed second supply potential by a negative supply rail. The positive supply rail is connected to an output pad via the high-side transistors to supply load current to a load and the negative supply rail is connected to the output pad via the low-side transistors to sink load current from the load. The two complementary transistors are complementary turned ON and OFF to avoid cross-conduction. Thus, the first transistor, when ON, is responsible for conducting load current in order to source the load current to the load while the second transistor is turned off (i.e., the second transistor is in blocking mode). In order to sink load current from the load, the roles of the two transistors are reversed. Here, the second transistor, when ON, is responsible for conducting load current in order to sink the load current from the load while the first transistor is turned off (i.e., the first transistor is in blocking mode).

FIG. 1 is a schematic block diagram of a gate driver system 100 with a clamping or a limiting circuit according to one or more implementations. The gate driver system 100 includes a transistor 101 and a gate driver 110 that controls a gate voltage Vg of the transistor 101 to drive the transistor 101 between switching states (e.g., on and off states). The transistor 101 may be employed as a high-side transistor or a low-side transistor in a half-bridge circuit that is used to generate a load current.

The transistor 101 may be an IGBT, a junction-gate field effect transistor (JFET) with a gate-source, or a MOSFET (e.g., Si MOSFETs or SiC MOSFETs), among other examples. It will be appreciated that one type of voltage-controlled transistor may be substituted for another type of voltage-controlled transistor. For example, when substituting a MOSFET for an IGBT, a MOSFET's drain may be substituted for an IGBT's collector, the MOSFET's source may be substituted for the IGBT's emitter, and the MOSFETs drain-source voltage Vds may be substituted for the IGBT's collector-emitter voltage Vce in any one of the examples described herein. Thus, any IGBT may be substituted by a MOSFET, or vice versa. An IGBT is a transistor that combines an input MOSFET and an output bipolar transistor. Accordingly, an IGBT is a MOS-gated device because the IGBT is the gate of the MOSFET that controls the state of the device. Specifically, the gate-emitter voltage of an IGBT or similar device is the control voltage. Thus, both the gate-source voltage Vgs and the gate-emitter voltage Vge can be used interchangeably herein when referring to a control voltage of a voltage-controlled transistor, depending on the transistor technology.

In the implementation illustrated in FIG. 1, the transistor 101 includes a gate G, a source S, and a drain D. The gate G of the transistor 101 is a capacitive load that can be charged and discharged to modulate the gate voltage Vg, thereby modulating the gate-source voltage Vgs. A voltage pulse may be output from the gate driver 110 as the control signal according to a pulse width modulation (PWM) scheme. Thus, the control signal may be switched between an ON voltage level (e.g., VH) and an OFF voltage level (VL) during a PWM cycle for controlling the transistor 101. This in turn charges and discharges the gate voltage Vg to turn on and off the transistor 101, respectively.

Alternatively, the gate driver 110 may use sourced and sinked currents as control signals to turn the transistor 101 on and off. For example, during the turn-on process, the gate driver 110 may provide (source) an ON current to the gate G of the transistor 101 in order to charge the gate to a sufficient voltage to turn on the transistor 101. In contrast, during the turn-off process, the gate driver 110 is used to draw (sink) an OFF current from the gate G of the transistor 101 in order to discharge the gate voltage Vg to a sufficient voltage to turn off the transistor 101. During a turn OFF event, after some small amount of time (e.g., small compared to the PWM cycle), the gate current decreases and reaches a zero value when the gate reaches approximately a zero value or a negative value. During a turn ON event, after some small amount of time (e.g., small compared to the PWM cycle), the gate current decreases and reaches a zero value when the gate reaches the positive supply level, minus any voltage drops.

The gate driver 110 includes control logic 111, a source FET 112, and a sink FET 113 connected to the source FET 112 in a half-bridge configuration. The control logic 111 receives control signals from a microcontroller (not illustrated) and controls the on/off states of the source FET 112 and the sink FET 113 based on the control signals. For example, the control logic 111 may implement a pulse-width modulation (PWM) scheme for controlling the source FET 112 and the sink FET 113. The source FET 112 and the sink FET 113 are operated in a complementary manner such that both the source FET 112 and the sink FET 113 are not turned on simultaneously to avoid cross-conduction.

The gate driver 110 is supplied with a first supply potential VCC (e.g., a positive supply voltage) and a second supply potential GND (e.g., ground) by a power supply 130. When the source FET 112 is turned on, an output pad Vout of the gate driver 110 is electrically coupled to the first supply potential VCC and the gate driver 110 outputs a voltage at the output pad Vout that is approximately the first supply potential VCC, less any voltage drop across the source FET 112 (e.g., a driver voltage drop). When the sink FET 113 is turned on, the output pad Vout of the gate driver 110 is electrically coupled to the second supply potential GND and the voltage at the output pad Vout is approximately the second supply potential GND.

Accordingly, the source FET 112 and the sink FET 113 operate as current sources when turned on. In particular, when turned on, the source FET 112 generates an on-current due to its connection to the first supply potential VCC. The on-current is output from the output pad Vout of the gate driver 110 and is used as a gate charging current. Thus, the source FET 112 provides an on-current to the gate G of the transistor 101 to increase the gate voltage Vg, which also causes the control voltage Vgs to increase to a level above a switching threshold (e.g., threshold voltage Vth). On the other hand, when the sink FET 113 is turned on, the sink FET 113 generates an off-current due to its connection to the second supply potential GND. The off-current is drawn into the output pad Vout of the gate driver 110 and is used as a gate discharge current. In other words, the off-current is sinked from the gate G of the transistor 101. As a result, the gate voltage Vg decreases, which causes the control voltage Vgs to decrease to a level that is below the switching threshold (e.g., threshold voltage Vth).

The output pad Vout of the gate driver 110 is coupled to the gate G of the transistor 101 by a turn-on current path 121 and a turn-off current path 122 that are connected in parallel to each other.

The turn-on current path 121 includes a first resistor 123 and a Zener diode 120 connected in series, with an anode of the Zener diode 120 connected to the gate G of the transistor 101 and a cathode of the Zener diode 120 connected to the first resistor 123. The turn-on current path 121 is configured to provide the on-current to the gate G of the transistor 101 to increase the control voltage Vgs above the switching threshold. The resistive value of the first resistor 123 may be small such that its voltage drop is negligible. For example, the first resistor 123 may be approximately 100 ohms.

The turn-off current path 122 includes a second resistor 124 and a directional diode 125 connected in series. The second resistor 124 may have a resistive value of approximately the same order of magnitude as the first resistor 123. For example, the second resistor 124 may be approximately 33 ohms. The second resistor 124 and the directional diode 125 are connected in parallel to the first resistor 123 and the Zener diode 120. The turn-off current path 122 is configured to sink a first portion of an off-current from the gate G of the transistor 101 to decrease the control voltage Vgs below the switching threshold. It is noted that a second, lesser portion of the off-current will also flow through the turn-on current path 121 (i.e., through the Zener diode 120 and the first resistor 123) due to the second resistor 124 having a smaller resistive value than a resistive value of the first resistor 123. That is, the gate discharge current will also flow through the Zener diode 120, but with a smaller amount than the portion that flows through the turn-off current path 122.

The gate driver system 100 also includes a pull-down resistor 126. One terminal of the pull-down resistor 126 is coupled to the gate G of the transistor 101 and to the anode of the Zener diode 120. The other terminal of the pull-down resistor 126 is coupled to the source S of the transistor 101. Thus, the pull-down resistor 126 is coupled to both the gate G and the source S of the transistor 101. The pull-down resistor 126 is used to provide a bias current $i_b$ for the Zener diode 120 to make sure its clamping voltage or limiting voltage is maintained fixed when the transistor 101 is fully turned on. The resistive value of the pull-down resistor 126 may be large relative to the first and the second resistors 123 and 124, such as approximately 10k ohms or the like.

The transistor 101 is designed according to a manufacturer's specifications with a rated maximum limit for the control voltage Vgs that represents a maximum voltage the transistor 101 can handle without being damaged. Exceeding this rated maximum limit may cause the transistor 101 to fail. As a result, it is beneficial to prevent the control voltage Vgs from exceeding the rated maximum limit for Vgs by a protection circuit. The benefit of the setup of the gate driver system 100 is that the Zener diode 120, as provided, acts as a protection device that prevents the control voltage Vgs from exceeding the rated maximum limit for Vgs.

In particular, while the transistor 101 is turned on (e.g., fully turned on), the Zener diode 120 limits the control voltage Vgs to a voltage level limit that is less than the maximum rated limit of the transistor 101. More particularly, the Zener diode 120 has a Zener breakdown voltage and the Zener diode 120 is configured to limit the control voltage Vgs to the voltage level limit less than the maximum rated limit based on the Zener breakdown voltage. For example, when the Zener diode 120 is conducting a reverse current, such as the turn-on current, the voltage drop across the Zener diode 120 is substantially equal to its Zener breakdown voltage. The actual voltage drop across the Zener diode 120 is referred to as the Zener voltage Vz or a clamping voltage of the Zener diode 120 and may be equal to or substantially equal to the Zener breakdown voltage. For example, the Zener voltage Vz may be +/−10% of the Zener breakdown voltage. Thus, the Zener diode 120 can be designed with a Zener voltage Vz that limits the gate voltage Vg and the control voltage Vgs to respective desired levels. Limiting the control voltage Vgs to the voltage level limit in this manner can also improve the performance of transistor 101 by maintaining the control voltage Vgs within a preferred voltage range.

The Zener diode 120 may limit the control voltage Vgs to the voltage level limit by clamping the control voltage Vgs to the voltage level limit (e.g., a clamped voltage level) based on its Zener breakdown voltage and the first supply potential VCC. If the first supply potential VCC of the power supply 130 exceeds the voltage level limit, the Zener diode 120 may clamp the control voltage Vgs to the voltage level limit depending on other power losses that exist between the power supply 130 and the control voltage Vgs of the transistor 101. In this case, the control voltage Vgs rises to a sufficient level during turn on of the transistor 101 to be clamped by the Zener diode 120 to the voltage level limit (e.g., a clamped voltage level). For example, when the transistor 101 is fully turned on, its control voltage Vgs is at its maximum level. In this circumstance, the control voltage Vgs would be clamped to (e.g., limited to) the voltage level limit to prevent the control voltage Vgs from exceeding the maximum rated limit for the control voltage Vgs of the transistor 101.

As an example, assume that the power supply 130 provides 15V (e.g., VCC=+15V), the voltage drop across the source FET 112 is 0.45V (e.g., due to the drain-source on resistance of the source FET 112), the voltage drop across the first resistor 123 is negligible, and the maximum rated limit of Vgs is 16V. In this example, assume that the first and second resistors 123 and 124 are 100Ω and 33Ω resistors, respectively. Also, because the source terminal S of the transistor 101 is connected to the second supply potential GND, the gate voltage Vg is equal to Vgs (e.g., Vg=Vgs), but this may not always be the case when the transistor 101 is used as a high-side transistor in a half-bridge configuration. It will be appreciated that any parameter value used herein is intended to be for demonstration purposes only and is in no way limiting to the use of other parameter values according to system design and application.

The maximum Vgs drive level, referred to as Vgsmax, when the transistor 101 is fully turned on is defined by VCC−0.45V—Vz, where Vgs should be limited to less than the maximum rated limit of 16V in order to protect the transistor 101. As an example, assume that the bias current ib is about 1 mA when the transistor 101 is fully turned on. Thus, this is the current that flows through the turn-on current path 121, even when the gate G is fully charged and the transistor 101 is fully turned on. If the Zener diode 120 is selected with Zener voltage Vz of 4.0V, then the maximum Vgs drive level Vgsmax is limited or clamped to 10.55V, which is well below the maximum rated limit of 16V but sufficient to keep the transistor 101 fully on. The control voltage Vgs remains fixed to, clamped to, or otherwise limited to this clamped voltage level of 10.55V when the transistor 101 is fully turned on due to the pull-down resistor 126. The Zener diode 120 effectively prevents the control voltage Vgs from increasing above this clamped voltage level.

In addition, the power loss of the Zener diode 120 is nearly zero since no or very little current is consumed when the transistor 101 is fully on. In particular, during the switching on of the transistor 101 (e.g., a switching time period in a range from approximately 10 nanoseconds (ns) to approximately 100 ns) that is performed for a PWM cycle, the Zener diode 120 has a large power loss, consuming approximately hundreds of milliwatts (mW). Once the transistor 101 is fully turned on, the Zener diode 120 has nearly zero power loss. The average power loss is nearly or substantially zero since the switching time period during which a large power loss is realized is very small relative to an entire duration of the PWM cycle. Thus, the power consumption of the Zener diode 120 during the switching time period is negligible relative to entire duration of the PWM cycle.

For example, using the same specifications, the maximum power loss through the Zener diode 120 is equal to Vz*Vgsmax/10kΩ=4.0V*10.55V/10kΩ=4.22 mW, where 10kΩ is the resistive value of the pull-down resistor 126. Accordingly, it can be said that, while the transistor 101 is turned on, a power loss resultant from the Zener diode 120 is substantially zero, meaning that the power loss is less than 20 mW, or more preferably less than 10 mW, or more preferably less than 5 mW, depending on the size of the pull-down resistor 126 and the Zener voltage Vz. While the transistor 101 is turned on (e.g., partially or fully turned on), a power loss of the Zener diode 120 consumes substantially zero of the on-current. Said differently, the Zener diode 120 consumes substantially zero of the on-current while the transistor 101 is partially or fully turned on.

However, additionally, it should be taken into account that the power supply 130 is rated to provide the first supply potential VCC within a predetermined power supply margin. That is, the first supply potential VCC is provided by the power supply 130 within a certain tolerance band or predetermined margin according to a manufacturer's specifications. This means for a power supply rated at +15V with a +/−10% tolerance range, the power supply 130 may supply a voltage anywhere between 13.5V and 16.5V and still be considered operating normally within a manufacturer's specifications of +/−10%. The higher the supply voltage, the higher the maximum Vgs drive level. This variation should be taken into account when ensuring that the maximum Vgs drive level does not exceed the maximum rated limit of the control voltage Vgs.

Applying the same calculations as above, but using 16.5V for the first supply potential VCC, the maximum Vgs drive level is limited or clamped to 12.05V, which is still well below the maximum rated limit of 16V. The power loss through the Zener diode 120 would be 4.82 mW. The control voltage Vgs remains fixed to, clamped to, or otherwise limited to this clamped voltage level of 12.05V when the transistor 101 is fully turned on due to the pull-down resistor 126. The Zener diode 120 effectively prevents the control voltage Vgs from increasing above this clamped voltage level. Thus, in a worst case in which the power supply 130 supplies a power at its upper limit of its rated power supply margin, the control voltage Vgs remains limited to a value less than the maximum rated limit of the control voltage Vgs.

This setup is particularly beneficial when the power supply 130 is rated to provide the first supply potential VCC within a predetermined power supply margin and the maximum rated limit of the control voltage Vgs is within the predetermined power supply margin (e.g., within 13.5V-16.5V), which demonstrates the highest risk for the maximum rated limit of the control voltage Vgs being exceeded.

Alternatively, in a situation where the power supply 130 provides an actual supply voltage for the first supply potential VCC of a certain value and the maximum rated limit of the control voltage Vgs is a voltage value within a 20% margin of the actual supply voltage, the Zener diode 120 would prevent the maximum rated limit of the control voltage Vgs from being exceeded.

Alternatively, in a situation where the power supply 130 provides an actual supply voltage for the first supply potential VCC of a certain value and the maximum rated limit of Vgs is a voltage value within a 10% margin of the actual supply voltage, the Zener diode 120 would prevent the maximum rated limit of the control voltage Vgs from being exceeded.

Alternatively, in a situation where the power supply 130 provides an actual supply voltage for the first supply potential VCC of a certain value and the maximum rated limit of Vgs is a voltage value within a 5% margin of the actual supply voltage, the Zener diode 120 would prevent the maximum rated limit of the control voltage Vgs from being exceeded.

The above-described setup can be compared with a different setup that results in unacceptable power losses. For example, a Zener diode could be provided in parallel with the pull-down resistor 126 instead of its location shown in FIG. 1. In this arrangement, a Zener diode with a higher Zener voltage (e.g., 14.3V) could be used to set the gate voltage Vg to a sufficient level to turn on the transistor 101. When the transistor 101 is fully turned on, Vgs=Vz=14.3V. In a worst-case scenario, the maximum current passing through this Zener diode is: Iz=(VCCmax-0.45V-Vz)/ 100Ω-Vz/101kΩ=(16.5V-0.45V-14.3V)/100Ω-14.3V/ 10kΩ=16.07 mA. The power loss by this Zener diode would be equal to Vz*Iz=14.3V*16.07 mA=0.23 W. This power loss is significantly more than the power loss demonstrated in the examples above in reference to FIG. 1.

On the other hand, if the Zener diode is removed entirely from the circuit, the control voltage Vgs would be equal to VCC−0.45V, which in the worst-case scenario would be equal to 16.05V when the first supply potential VCC is at its maximum of 16.5V. This control voltage Vgs would exceed the maximum rated limit of 16V. Furthermore, if a voltage spike occurs at the supply voltage, there is no protection and the control voltage Vgs would rise even further.

Accordingly, the gate driver system 100 includes a protection circuit including the Zener diode 120 in the turn-on current path and the pull-down resistor 126 that prevents the control voltage Vgs from exceeding the rated maximum limit of the transistor 101 while introducing no-to-minimal power loss in the gate driver system 100, thereby improving or at least not hindering system efficiency compared to traditional systems.

As indicated above, FIG. 1 is provided merely as an example. Other examples are possible and may differ from what was described with regard to FIG. 1. For example, in some implementations, the gate driver 110 may have a different driver circuitry that drives the gate G of the transistor 101. In some implementations, additional circuit components may be added without deviating from the disclosure provided above. For example, one or more resistors may be added in series with another resistor. In some implementations, the transistor 101 may be a low-side transistor in a half-bridge circuit. In some implementations, the transistor 101 may be a high-side transistor in a half-bridge circuit.

Aspects

Some implementations, as described herein, may be summarized by the following aspects:

1. A gate driver system, comprising: a transistor configured to be driven between switching states, the transistor comprising a control terminal, wherein a control voltage is a gate-source voltage or a gate-emitter voltage of the transistor and has a maximum rated limit; and a gate driver coupled to the control terminal of the transistor by a turn-on current path and a turn-off current path, the gate driver being configured to control the control voltage in order to drive the transistor between the switching states, wherein the turn-on current path comprises a first resistor and a Zener diode connected in series, with an anode of the Zener diode connected to the control terminal and a cathode of the Zener diode connected to the first resistor, wherein the turn-on current path is configured to provide an on-current to increase the control voltage above a switching threshold, wherein the turn-off current path comprises a second resistor and a directional diode connected in series, wherein the second resistor and the directional diode are connected in parallel to the first resistor and the Zener diode, wherein the turn-off current path is configured to sink a first portion of an off-current to decrease the control voltage below the switching threshold, and wherein, while the transistor is turned on, the Zener diode is configured to limit the control voltage to a voltage level limit that is less than the maximum rated limit.

2. The gate driver system of aspect 1, wherein the Zener diode has a Zener breakdown voltage, and the Zener diode is configured to limit the control voltage to the voltage level limit less than the maximum rated limit based on the Zener breakdown voltage.

3. The gate driver system of any of the previous aspects, while the transistor is turned on, the Zener diode is configured to clamp the control voltage to the voltage level limit.

4. The gate driver system of any of the previous aspects, wherein the turn-on current path is configured to sink a second portion of the off-current to decrease the control voltage below the switching threshold.

5. The gate driver system of any of the previous aspects, wherein the on-current is configured to flow through the Zener diode resulting in a predetermined voltage drop between a positive power supply and the control terminal, wherein the predetermined voltage drop limits the control voltage to the voltage level limit.

6. The gate driver system of any of the previous aspects, wherein, while the transistor is turned on, a power loss of the Zener diode is substantially zero.

7. The gate driver system of any of the previous aspects, wherein, while the transistor is turned on, a power loss of the Zener diode is less than 20 mW.

8. The gate driver system of any of the previous aspects, wherein, while the transistor is turned on, a power loss of the Zener diode is less than 10 mW.

9. The gate driver system of any of the previous aspects, wherein, while the transistor is turned on, a power loss of the Zener diode consumes substantially zero of the on-current.

10. The gate driver system of any of the previous aspects, wherein, while the transistor is fully turned on, the Zener diode consumes substantially zero of the on-current.

11. The gate driver system of any of the previous aspects, further comprising: a positive power supply coupled to the control terminal via the gate driver and is configured to provide a supply voltage to turn on the transistor, wherein, while the transistor is turned on, the control voltage is limited to the voltage level limit derived from the supply voltage minus a driver voltage drop of the gate driver, minus a resistive voltage drop across the first resistor, and minus a Zener voltage of the Zener diode.

12. The gate driver system of any of the previous aspects, further comprising: a positive power supply coupled to the control terminal via the gate driver and is configured to provide a supply voltage to the gate driver to turn on the transistor, wherein the positive power supply is rated to provide the supply voltage within a predetermined power supply margin and the maximum rated limit of the control voltage is within the predetermined power supply margin.

13. The gate driver system of any of the previous aspects, further comprising: a positive power supply coupled to the control terminal via the gate driver and is configured to provide a supply voltage to the gate driver to turn on the transistor, wherein the maximum rated limit of the control voltage is a voltage value within a 20% margin of the supply voltage.

14. The gate driver system of any of the previous aspects, further comprising: a positive power supply coupled to the control terminal via the gate driver and is configured to provide a supply voltage to the gate driver to turn on the transistor, wherein the maximum rated limit of the control voltage is a voltage value within a 10% margin of the supply voltage.

15. The gate driver system of any of the previous aspects, further comprising: a positive power supply coupled to the control terminal via the gate driver and is configured to provide a supply voltage to the gate driver to turn on the transistor, wherein the maximum rated limit of the control voltage is a voltage value within a 5% margin of the supply voltage.

16. The gate driver system of any of the previous aspects, wherein the anode of the Zener diode connected directly to the control terminal.

17. The gate driver system of any of the previous aspects, further comprising a pull-down resistor having a resistor terminal coupled to both the control terminal and the anode of the Zener diode.

18. The gate driver system of any of the previous aspects, wherein the pull-down resistor is configured to generate a bias current through the Zener diode when the transistor is fully turned on.

19. The gate driver system of any of the previous aspects, wherein exceeding the maximum rated limit by the control voltage causes damage to the transistor.

20. A gate driver system, comprising: a transistor configured to be driven between switching states, the transistor comprising a control terminal, a first load path terminal, and a second load path terminal, wherein the transistor is configured to conduct a load current from the first load path terminal to the second load path terminal based on a control voltage, and wherein the control voltage is a voltage difference between a voltage at the control terminal and a voltage at the second load path terminal, wherein the control voltage has a maximum rated limit; and a gate driver coupled to the control terminal of the transistor by a turn-on current path and a turn-off current path, the gate driver being configured to control the control voltage in order to drive the transistor between the switching states, wherein the turn-on current path comprises a first resistor and a Zener diode connected in series, with an anode of the Zener diode connected to the control terminal and a cathode of the Zener diode connected to the first resistor, wherein the turn-on current path is configured to provide an on-current to increase the control voltage above a switching threshold, wherein the turn-off current path comprises a second resistor and a directional diode connected in series, wherein the second resistor and the directional diode are connected in parallel to the first resistor and the Zener diode, wherein the turn-off current path is configured to sink a first portion of an off-current to decrease the control voltage below the switching threshold, and wherein, while the transistor is turned on, the Zener diode is configured to limit the control voltage to a voltage level limit that is less than the maximum rated limit.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some implementations, a single act may include or may be broken into multiple sub acts. Such sub acts may be included and part of the disclosure of this single act unless explicitly excluded.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A gate driver system, comprising:
a transistor configured to be driven between switching states, the transistor comprising a control terminal, wherein a control voltage is a gate-source voltage or a gate-emitter voltage of the transistor and has a maximum rated limit; and
a gate driver coupled to the control terminal of the transistor by a turn-on current path and a turn-off current path, the gate driver being configured to control the control voltage in order to drive the transistor between the switching states,
wherein the turn-on current path comprises a first resistor and a Zener diode connected in series, with an anode of the Zener diode connected to the control terminal and a cathode of the Zener diode connected to the first resistor, wherein the turn-on current path is configured to provide an on-current to increase the control voltage above a switching threshold, wherein the turn-off current path comprises a second resistor and a directional diode connected in series, wherein the second resistor and the directional diode are connected in parallel with the first resistor and the Zener diode, wherein the turn-off current path is configured to sink a first portion of an off-current to decrease the control voltage below the switching threshold, and wherein, while the transistor is turned on, the Zener diode is configured to limit the control voltage to a voltage level limit that is less than the maximum rated limit.

2. The gate driver system of claim 1, wherein the Zener diode has a Zener breakdown voltage, and the Zener diode is configured to limit the control voltage to the voltage level limit less than the maximum rated limit based on the Zener breakdown voltage.

3. The gate driver system of claim 1, wherein while the transistor is turned on, the Zener diode is configured to clamp the control voltage to the voltage level limit.

4. The gate driver system of claim 1, wherein the turn-on current path is configured to sink a second portion of the off-current to decrease the control voltage below the switching threshold.

5. The gate driver system of claim 1, wherein the on-current is configured to flow through the Zener diode, thereby resulting in a predetermined voltage drop between a positive power supply and the control terminal, wherein the predetermined voltage drop limits the control voltage to the voltage level limit.

6. The gate driver system of claim 5, wherein, while the transistor is turned on, a power loss of the Zener diode is substantially zero.

7. The gate driver system of claim 5, wherein, while the transistor is turned on, a power loss of the Zener diode is less than 20 mW.

8. The gate driver system of claim 5, wherein, while the transistor is turned on, a power loss of the Zener diode is less than 10 mW.

9. The gate driver system of claim 5, wherein, while the transistor is turned on, a power loss of the Zener diode consumes substantially none of the on-current.

10. The gate driver system of claim 5, wherein, while the transistor is fully turned on, the Zener diode consumes substantially none of the on-current.

11. The gate driver system of claim 1, further comprising:
a positive power supply coupled to the control terminal via the gate driver and is configured to provide a supply voltage to turn on the transistor,
wherein, while the transistor is turned on, the control voltage is limited to the voltage level limit derived from the supply voltage minus a driver voltage drop of the gate driver, minus a resistive voltage drop across the first resistor, and minus a Zener voltage of the Zener diode.

12. The gate driver system of claim 1, further comprising:
a positive power supply coupled to the control terminal via the gate driver and which is configured to provide a supply voltage to the gate driver to turn on the transistor,
wherein the positive power supply is rated to provide the supply voltage within a predetermined power supply margin and the maximum rated limit of the control voltage is within the predetermined power supply margin.

13. The gate driver system of claim 1, further comprising:
a positive power supply coupled to the control terminal via the gate driver and which is configured to provide a supply voltage to the gate driver to turn on the transistor,
wherein the maximum rated limit of the control voltage is a voltage value within a 20% margin of the supply voltage.

14. The gate driver system of claim 1, further comprising:
a positive power supply coupled to the control terminal via the gate driver and which is configured to provide a supply voltage to the gate driver to turn on the transistor,
wherein the maximum rated limit of the control voltage is a voltage value within a 10% margin of the supply voltage.

15. The gate driver system of claim 1, further comprising:
a positive power supply coupled to the control terminal via the gate driver and which is configured to provide a supply voltage to the gate driver to turn on the transistor,
wherein the maximum rated limit of the control voltage is a voltage value within a 5% margin of the supply voltage.

16. The gate driver system of claim 1, wherein the anode of the Zener diode is connected directly to the control terminal.

17. The gate driver system of claim 1, further comprising a pull-down resistor having a resistor terminal coupled to both the control terminal and the anode of the Zener diode.

18. The gate driver system of claim 17, wherein the pull-down resistor is configured to generate a bias current through the Zener diode when the transistor is fully turned on.

19. The gate driver system of claim 1, wherein exceeding the maximum rated limit by the control voltage causes damage to the transistor.

20. A gate driver system, comprising:
a transistor configured to be driven between switching states, the transistor comprising a control terminal, a first load path terminal, and a second load path terminal, wherein the transistor is configured to conduct a load current from the first load path terminal to the second load path terminal based on a control voltage, and wherein the control voltage is a voltage difference between a voltage at the control terminal and a voltage at the second load path terminal, wherein the control voltage has a maximum rated limit; and
a gate driver coupled to the control terminal of the transistor by a turn-on current path and a turn-off current path, the gate driver being configured to control the control voltage in order to drive the transistor between the switching states,
wherein the turn-on current path comprises a first resistor and a Zener diode connected in series, with an anode of the Zener diode connected to the control terminal and a cathode of the Zener diode connected to the first resistor, wherein the turn-on current path is configured to provide an on-current to increase the control voltage above a switching threshold,
wherein the turn-off current path comprises a second resistor and a directional diode connected in series, wherein the second resistor and the directional diode are connected in parallel with the first resistor and the Zener diode, wherein the turn-off current path is configured to sink a first portion of an off-current to decrease the control voltage below the switching threshold, and wherein, while the transistor is turned on, the Zener diode is configured to limit the control voltage to a voltage level limit that is less than the maximum rated limit.

\* \* \* \* \*